(12) United States Patent
White

(10) Patent No.: US 7,103,282 B2
(45) Date of Patent: Sep. 5, 2006

(54) ALL OPTICAL CLOCK RECOVERY

(75) Inventor: John Kenton White, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 672 days.

(21) Appl. No.: 10/191,512

(22) Filed: Jul. 10, 2002

(65) Prior Publication Data

US 2003/0043433 A1 Mar. 6, 2003

Related U.S. Application Data

(60) Provisional application No. 60/303,778, filed on Jul. 10, 2001.

(51) Int. Cl.
*H04B 10/00* (2006.01)

(52) U.S. Cl. ............ 398/155; 398/154; 398/175; 398/176; 385/1; 385/2; 385/3; 385/4; 385/5; 385/15; 372/29.01; 372/29.23; 372/43; 372/44; 372/11; 372/12; 372/13; 372/18

(58) Field of Classification Search ............ 398/175, 398/176, 154, 155; 385/1–5, 15, 314; 372/29.01–29.23, 372/43, 44, 11–13, 18, 6
See application file for complete search history.

(56) References Cited

U.S. PATENT DOCUMENTS

| | | | |
|---|---|---|---|
| 4,079,339 A * | 3/1978 | Kobayashi et al. | 372/97 |
| 5,353,146 A | 10/1994 | Webb | |
| 5,446,573 A | 8/1995 | Lomashevitch | |
| 6,314,115 B1 * | 11/2001 | Delfyett et al. | 372/6 |
| 6,707,839 B1 * | 3/2004 | Sakata | 372/96 |

FOREIGN PATENT DOCUMENTS

| | | |
|---|---|---|
| EP | 0 378 447 A | 7/1990 |
| WO | WO 00/55950 A | 9/2000 |

OTHER PUBLICATIONS

B.K. Mathason and P.J. Delfyett, Pulsed injectino locking dynamics of passively mode-locking external-cavity semiconductor laser systems for all-optical clock recovery, Aug. 2000, J. of Lightwave Technology, IEEE vol. 18, No. 8, pp. 1111-1120.*

Mathason et al., J. Lightwave Technology, Vo. 18, No. 18, p. 1111-1120 Aug. 2000.*

(Continued)

*Primary Examiner*—Hanh Phan

(57) ABSTRACT

All optical clock recovery includes a transmitter for generating an optical timing signal. The transmitter includes a semiconductor laser for the production of a dynamically synchronizable timing signal, the laser having an external resonator for feedback of the timing signal to the laser, the feedback having a delay time greater than a relaxation oscillation time for the laser, and the laser outputting an optical timing signal having a characteristic dynamic. The transmitter supplies the optical timing signal to a receiver configured to receive the timing signal and to synchronize to the laser on receipt of the timing signal, such that the receiver outputs a recovered timing signal having the characteristic dynamic. A number of receivers may be provided in sequence along an optical path, each receiver configured to receive the timing signal originally outputted with the characteristic dynamic from the transmitter, and synchronized to the transmitter on receiving the signal and thereby outputting a recovered timing signal having the characteristic dynamic. All optical clock recovery is provided without increased electronic complexity and avoids thermal drift.

21 Claims, 8 Drawing Sheets

OTHER PUBLICATIONS

Mathason, B.K. and Delfyett, P.J.: "Pulsed Injection Locking Dynamics of Passively Mode-Locked External-Cavity Semiconductor Laser Systems for All-Optical Clock Recovery".

O'Mahony M.J.: "Semiconductor Laser Amplifiers as Repeaters" International Conference on Integrated Optics and Optical Fibre Communication (IOOC) and European Conference.

* cited by examiner

ALL OPTICAL CLOCK RECOVERY

BACKGROUND OF THE INVENTION

This invention relates to clock recovery for optical networks. Optical network systems often employ a clock that generates periodic, accurately spaced signals for various purposes including synchronization of interconnected equipment and the regulation of processor operations.

However, many physical mechanisms prevent the accurate optical transmission of a clock signal. For example, spontaneous emission noise changes the clock pulse shape; timing jitter changes the timing between the clock pulses; signal attenuation along the fibre changes the clock pulse power; and the like.

As a result of such optical signal degradation, clock pulses need to be retimed, reshaped and re-amplified at strategic points along an optical network in order to restore degraded clock pulses to their former quality (optical 3R regeneration). This is referred to as clock recovery.

There are various forms of clock recovery presently employed. One method uses the tuned circuit. Transition in the digital signal is used to stimulate an impulse response from a tuned circuit, which then oscillates with decaying amplitude until it is re-stimulated. However, noise in incoming signals may produce extraneous impulses that stimulate the tuned circuit and thereby corrupt the clock signal. Further, as its frequency of operating cannot change, the tuned circuit cannot handle jitter.

Another form of clock recovery employs a phase locked loop (PLL), for example, Tong et al., IEEE Photon. Tech. Lett., vol. 12, pp. 1064–1066, 2000. A PLL comprises a phase detector, a loop filter amplifier and a voltage-controlled oscillator. However, employing a PLL adds additional complexity and cost to the system. Further, it is unable to exactly reproduce or regenerate an incoming signal, resulting in deviations from synchronicity.

One method of optical clock recovery used employs an external cavity resonator in a receiver laser carefully tuned to a specific frequency, for example, Mathason and Delfyett, J., Lightwave. Tech., vol. 18, pp. 1111–1120, 2000. Weak injection of a signal with a frequency component at the tuned frequency results in the external cavity configuration becoming locked to the tuned frequency component of the incoming signal. While such systems are able to initially provide synchronicity, phase shifting or thermal drift arising from temperature fluctuations eventually causes the external cavity resonator frequency to vary with the result that such a system loses coherence.

Accordingly, it is desirable to have a clock recovery system that does not substantially rely on electronic components in the clock recovery process, that is not affected by thermal drift and that allows the system to remain synchronized as long as there is an active connection between components.

SUMMARY OF THE INVENTION

It is an object of this invention to provide improved clock recovery that addresses the problems identified above.

According to the present invention, there is a transmitter for generating an optical timing signal. The transmitter includes a semiconductor laser that produces a dynamically synchronizable timing signal. The laser has an external resonator for feedback of the timing signal. The feedback of the timing signal has a delay time greater than the relaxation oscillation time for the laser. The laser outputs an optical timing signal having a characteristic dynamic. The timing signal can be supplied to an appropriately configured receiver that outputs a recovered timing signal having the characteristic dynamic.

In a further aspect, there is provided a receiver includes a semiconductor laser configured to receive the dynamically synchronizable timing signal from the transmitter. The laser is adapted to synchronize to the transmitter on receipt of the timing signal whereby a recovered timing signal having the characteristic timing signal is outputted by the receiver.

In yet another aspect, there is provided a method of timing an optical link that includes the steps of generating a dynamically synchronizable timing signal by a transmitter laser, resonating the signal in an external resonator, where the feedback of the timing signal in the resonator has a delay time greater than a relaxation oscillation time for the transmitter. The timing signal is outputted for propagation along an optical path. The timing signal is used to dynamically synchronize a receiver laser.

In an embodiment, the timing signal may be outputted by receiver lasers positioned along the optical path and used to dynamically synchronize a subsequent receiver laser positioned further along the optical path.

In yet another aspect, there is provided an optical link including a transmitter that produces a dynamically synchronizable timing signal. The transmitter includes a laser having an external resonator for feedback of the timing signal. The feedback of the timing signal has a delay time greater than the relaxation oscillation time for the laser. The laser outputs an optical timing signal having a characteristic dynamic. The timing signal can be supplied to an appropriately configured receiver that outputs a recovered timing signal having the characteristic dynamic. The link also includes a receiver configured to receive the timing signal. The receiver includes a semiconductor laser configured to receive the dynamically synchronizable timing signal from the transmitter. The laser is adapted to synchronize to the transmitter on receipt of the timing signal whereby a recovered timing signal having the characteristic timing signal is outputted by the receiver.

In another embodiment, the optical link includes a plurality of receivers each positioned in sequence along an optical path, configured to receive the dynamically synchronizable timing signal originally outputted with the characteristic dynamic from the transmitter, synchronized to the transmitter on receiving the signal and thereby outputting a recovered timing signal having the characteristic dynamic.

The invention disclosed herein provides for optical clock recovery using dynamical synchronization, the complexity of which is not increased by additional electronic components. By not employing a receiver laser with an external cavity resonator, thermal drift in the signal output of a receiver laser is avoided. Further, the dynamics of the original clock pulse output signal is reproduced by successive regenerators along the optical path.

In this specification, "dynamics" relates to the time evolution of state variables internal or external to the transmitter or receiver laser. Internal state variables include carrier density, photon density, longitudinal field distribution, relative facet phase, etc. External state variables are electric field intensity, electric field phase, and the like. The term "reproduce" relates to an internal or external state variable or signal that is reproduced if the dynamics of that variable are duplicated within acceptable error. A functional definition is that the correlation function:

$$C(t) = \frac{x_1(t)x_2(t)}{\sqrt{(x_1(t)^2)(x_2(t)^2)}}$$

is close to 1, where $x_1$ and $x_2$ are any state variables and the operator (t) denotes time average.

The term "recovery" refers to the processing of a second signal so that it reproduces a first signal as it existed immediately after being created by a transmitter.

The term "synchronization" refers to the reproduction of the dynamics of a first laser by the dynamics of the second laser.

BRIEF DESCRIPTION OF THE DRAWINGS

Other aspects and features of the present invention will become apparent to those ordinarily skilled in the art upon review of the following description of specific embodiments of the invention in conjunction with the accompanying figures in which.

DETAILED DISCLOSURE OF THE EMBODIMENT(S)

Figure 1:
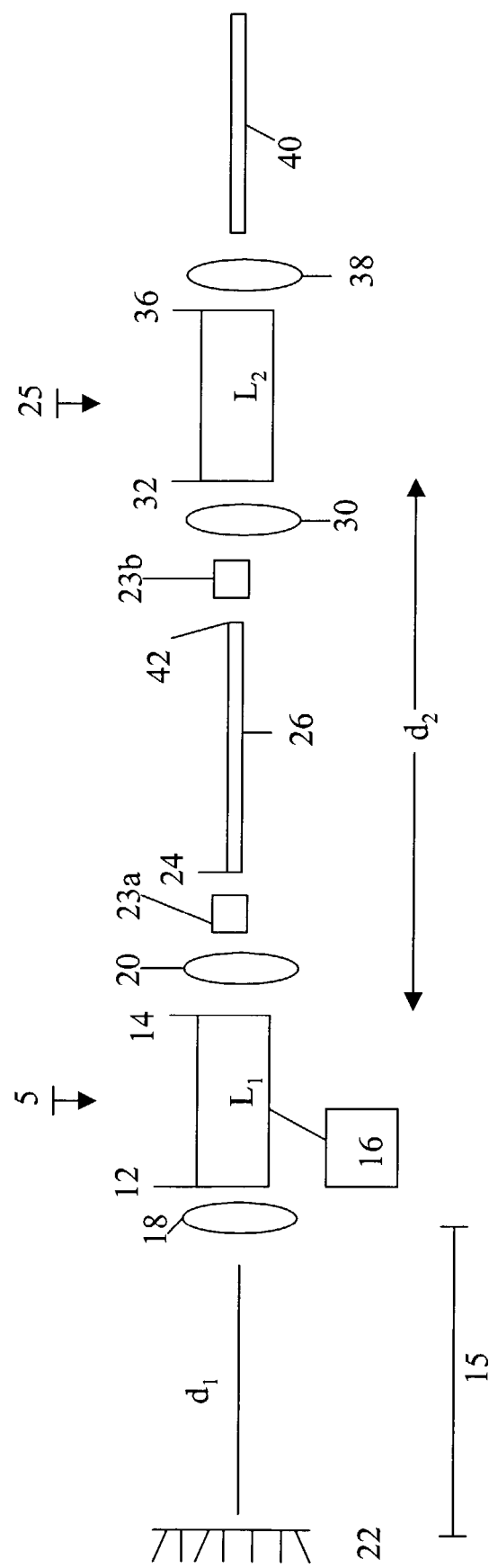
FIG. 1 is a schematic illustrating in block diagram a transmitting laser and a receiving laser located further along the optical path, in accordance with an embodiment of the invention.
Figure 2:
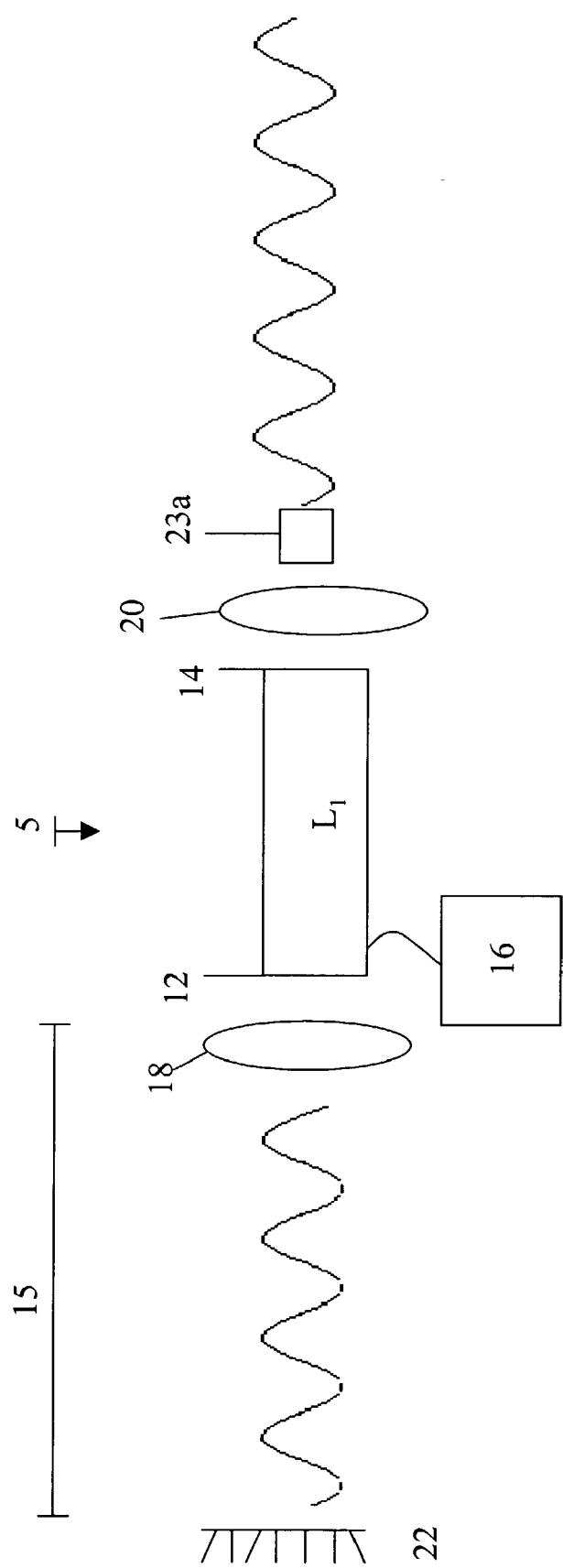
FIG. 2 is a schematic illustrating the transmitting laser of FIG. 1.

Referring to FIGS. 1 and 2, a transmitting laser 5 is a semiconductor laser diode $L_1$ with gain in an external cavity geometry capable of producing a pulsed optical signal for use as an optical clock signal for an optical network.

The laser diode $L_1$ has two emitting facets 12 and 14, which can be coated with anti-reflection or high-reflection coating accordingly. A clock signal generator 16 is connected to the laser diode $L_1$ to generate the optical pulse train. The clock signal generator is positioned at the interface between different physical layers.

An optical resonator 15 is located between facet 12 of the laser diode $L_1$ and a planar mirror 22, and forms the external cavity for laser diode $L_1$. Clock pulses emitted from facet 12 oscillates as between the laser diode $L_1$ and the planar mirror 22 positioned a distance $d_1$ from facet 12. A pulse emitted from facet 12 travels the feedback loop to the planar mirror 22 and back to facet 12 in round trip time t. Planar mirror 22 may be, for example, a partially silvered reflective surface or a 100% reflective surface and an optical attenuator.

A lens 18 may be positioned so as to direct the clock signal from the planar mirror 22 to assist focussing the clock signal onto facet 12.

Feedback to the optical resonator 15 selects and locks the desired clock frequency. The external cavity length $d_1$ may be varied including by using micromechanical, microelectronic or piezoelectrical positioning to physically move planar mirror 22. In addition, MEMS may also be used.

The clock frequency may also be changed by changing the operating conditions of the laser diode $L_1$, for example, by varying an electrical current to the laser diode $L_1$ using conventional methods.

An optical detector (not shown) may be connected to the clock generator 16 to monitor the optical clock pulse train. The optical signal may be synchronized to a signal of an electrical clock (not shown), which would be provided to assist the maintenance of an appropriate clock signal frequency for a purpose. A fast detector detects the optical signal and compares it with the signal from the electric clock to determine the necessary changes to the operation of the laser diode $L_1$ or external cavity length to maintain synchronization to the electrical clock.

The clock signal generator 16 may be synchronized to a pre-existing clock signal, for example, to a phase locked loop electronic oscillator, a signal from an atomic clock, a mechanical pendulum, a Building Information Timing Supply (BITS), or the like.

The synchronization of the optical signal may be to a different physical layer, for example, an electrical or mechanical layer.

A laser output oscillates with large amplitude when the laser is first turned on or when the laser is perturbed from its continuous wave operation. These large amplitude oscillations are known as relaxation oscillations. In circumstances where the round trip time $t_1$ for the optical clock pulse train to travel the feedback loop to the planar mirror 22 and back to facet 14 is greater than the time required for the relaxation oscillations to reach an amplitude of zero ($t_{RO}$) ("relaxation oscillation time"), the clock pulses transmitted by the transmitting laser 5 may be made to display a rigid set of dynamics, as depicted in FIG. 4, which are independent of the internal initial state of the laser. That is, the dynamics of the transmitting laser 5 are determined by the light injected into the laser diode $L_1$ at facet 12 from the external cavity 15.

As such, the external cavity length $d_1$ (or otherwise, the feedback delay time) is to be greater than the coherence length of the signal from laser diode $L_1$, in order to be made to display the rigid set of dynamics.

Figure 4A:
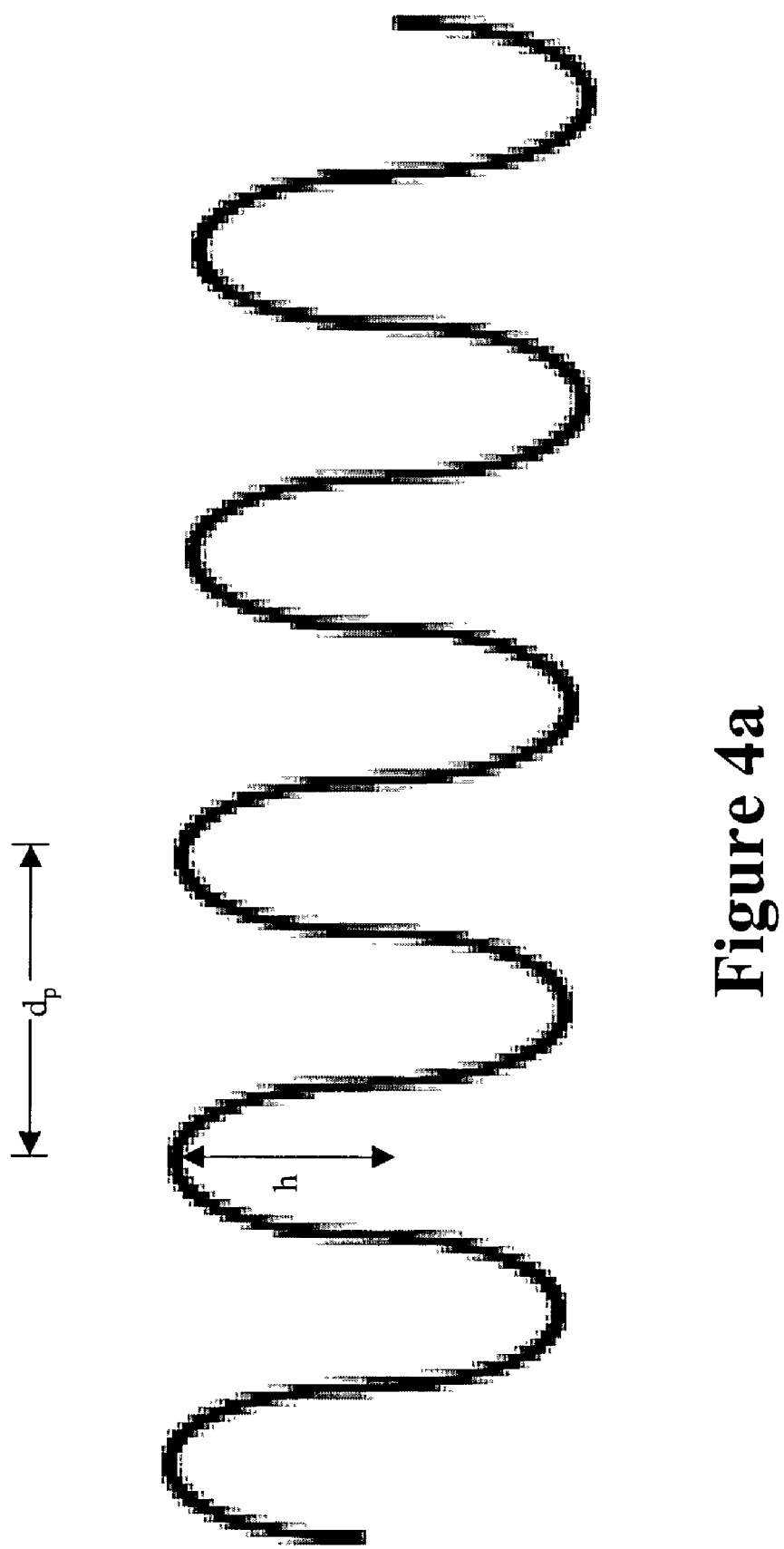
FIG. 4a illustrates a characteristic dynamic of a clock pulse emitted from a transmitting laser of FIG. 1.

FIG. 4a depicts a typical output of the optical clock transmitter 5 as it emerges from facet 14. The pulse signal is comprised of a periodic stream of pulses with a time t between the pulses. The distance $d_p$ between pulses are uniform and the pulses are substantially uniform height h. Each pulse is comprised of a pulse width w and pulse height h. The output displays a particular set of dynamics.

Figure 3:
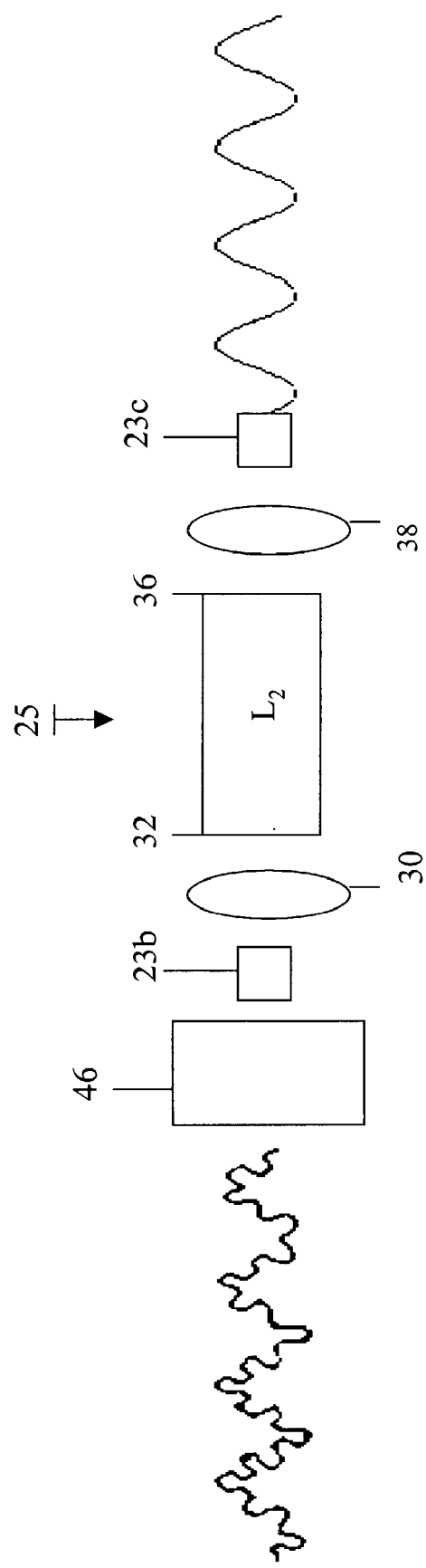
FIG. 3 is a schematic illustrating the regenerating laser of FIG. 1.

Referring to FIGS. 1 and 3, the clock signal emerges from facet 14 of the laser diode $L_1$. A convergent lens 20 focuses the signal onto a cleaved optical fibre facet 24, which is the end of an optical fibre 26 along which the clock pulses then propagate a distance $d_2$. The laser diode $L_1$ is not mutually coupled with optical fibre 26. An isolator 23a may be positioned between convergent lens 20 and the fibre facet 24 to prevent light from returning back to laser diode $L_1$ and avoid mutual coupling.

Figure 4B:
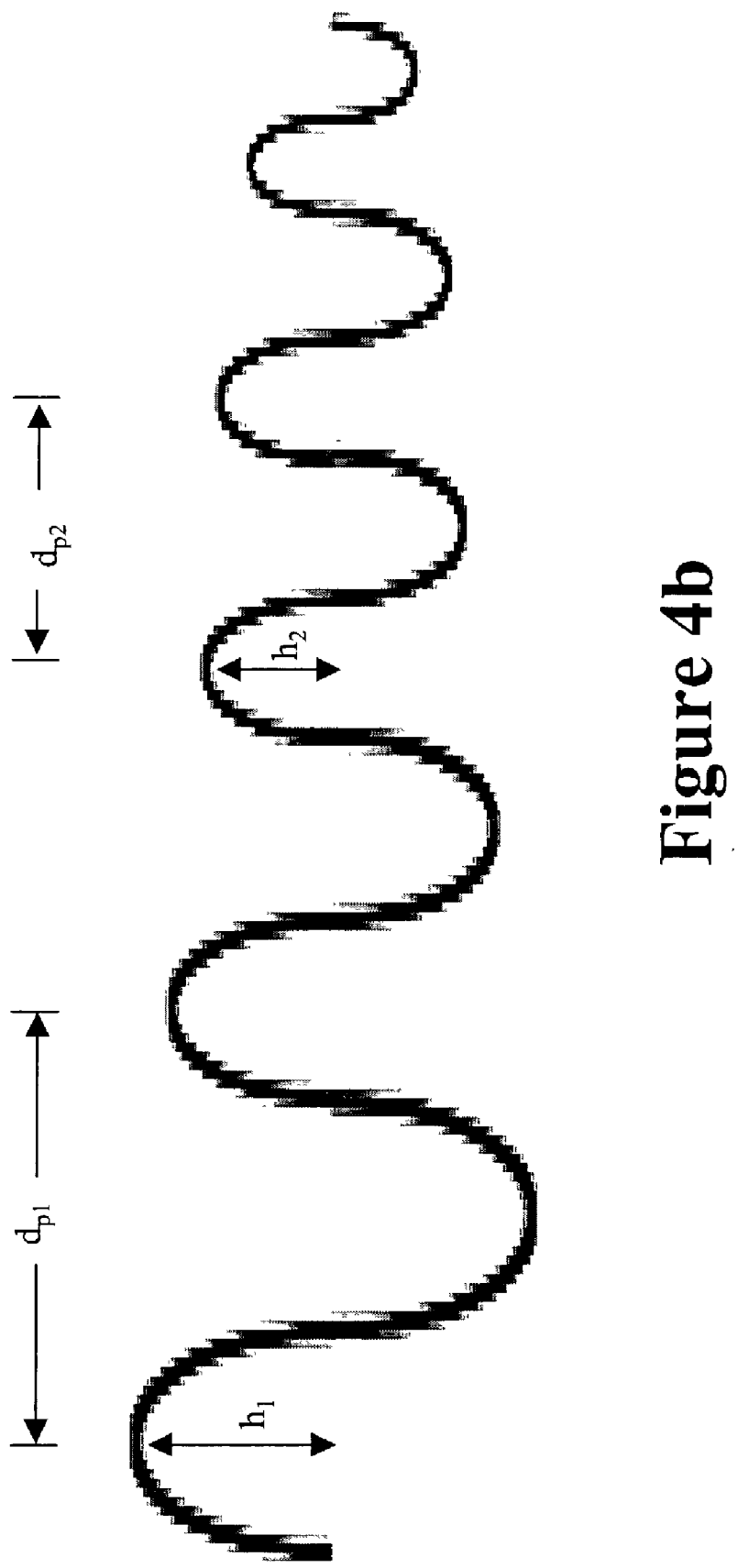
FIG. 4b illustrates a degraded clock pulse of FIG. 4a a distance along an optical path.

Propagation of the pulse train in FIG. 4a may produce irregularities, including noise on the signal, variations in the distance $d_p$ between pulses, variations in the pulse width, variations in the height h of the pulses, and the like. FIG. 4b depicts an example of a pulse train further along the optical path, displaying decreased amplitude height h and jitter. The receiver output in FIG. 5 shows that the pulse train, after passing through the receiver unit, is of a smooth profile, having a uniform distance $d_p$ between pulses and a uniform height h of the pulses.

The optical fibre cable 26 terminates at a receiver laser 25. The receiver laser 25 is similar to the clock pulse transmitting laser 5, but lacks an external cavity.

Figure 5:
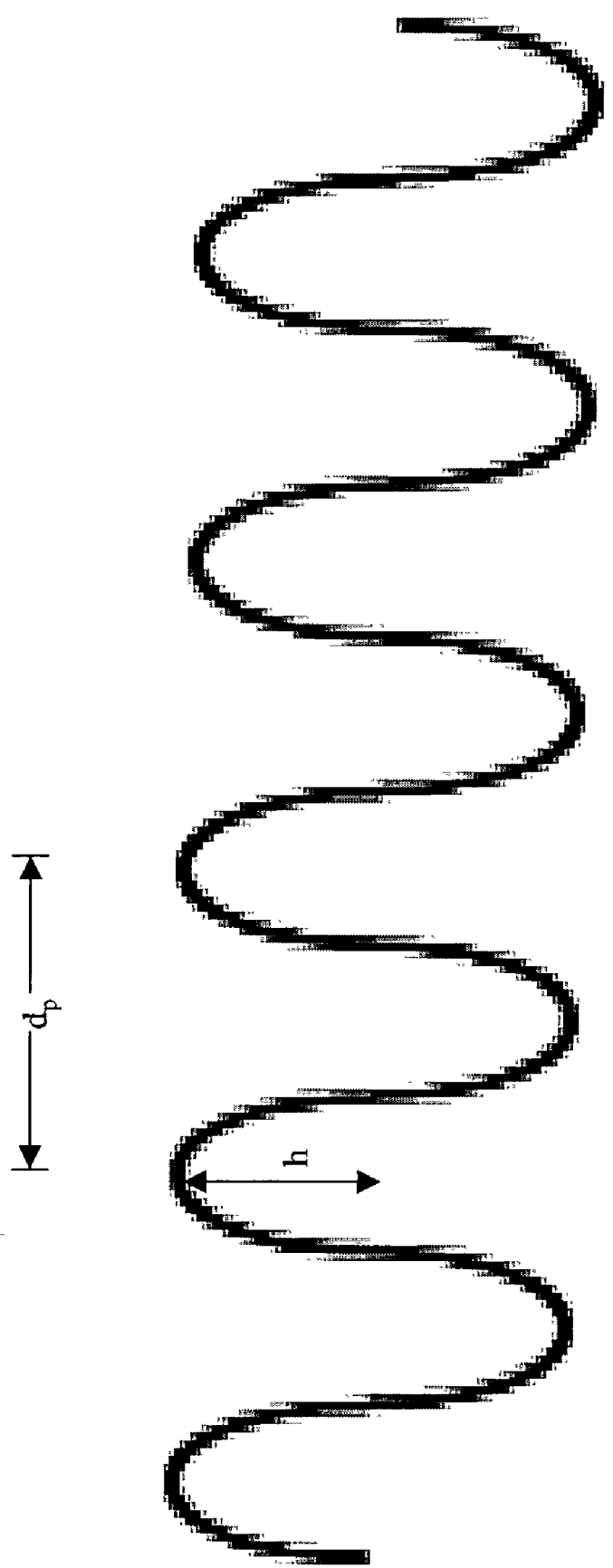
FIG. 5 illustrates the dynamics of the output from a regenerating laser of FIG. 3.

For receiver laser 25 to produce a clock signal output, for example, as depicted in FIG. 5, displaying the same set of dynamics as depicted by the output of transmitting laser 5, as depicted in FIG. 4, the clock signal incident on facet 32 is a signal that can be reproduced by laser diode $L_2$ in an arbitrary external cavity configuration where the external cavity length, or otherwise the feedback delay time, t is greater than $t_{RO}$ (relaxation oscillation time).

The receiver laser 25 comprises a laser diode $L_2$. Laser diode $L_2$ is substantially the same as laser diode $L_1$ in physical operation, for example, in terms of threshold, wavelength, external efficiency, power, and the like. Preferably, the laser diodes are identical, (in this sense, "identical" means, the same to the extent measurable or detectable, within the error of detection using detection equipment). It will be appreciated that the more dissimilar the lasers, the more errors are likely to be propagated in the system.

The similarity of laser diodes $L_1$ and $L_2$, and therefore, the suitability of laser diode $L_2$ for dynamic synchronization, may be determined by various means including by matching measured laser parameters. For example, a laser diode to be tested for suitability is incorporated into an external cavity configuration having a constant external cavity length to maintain the strength of feedback, and various operating parameters are measured. A second laser diode is then substituted into the external cavity configuration and the same operating parameters are measured. Where no measurable differences are detected by the detection equipment used, the laser diodes may be used in an optical link, each being acceptable as transmitter lasers or receiver lasers.

Alternatively, laser diodes may be determined to be suitable where pulse height, pulse width, pulse spacing and pulse period of the output, as exemplified in FIGS. 4a and 5, coincide with the outputs of other suitable laser diodes. In effect, lasers that produce the same dynamical properties in the same operating conditions are suitable for use.

The signal properties and pulse properties of the clock signal are related to the laser diode through a mathematical relation involving properties of the receiver laser 25, for example, relaxation oscillation, damping and the like. The signal properties, for example, the pulse height, pulse width and time between pulses, necessary for dynamic synchronization can be predicted where properties of the selected receiver laser 25 are known. An example of a mathematical relationship is set out in "High-Speed picosecond pulse generation in semiconductor lasers with incoherent optical feedback," K. Otsukaand J-L Chern, Optics Letters, vol. 16, pp. 1759–1761, 1992, where the oscillation frequency $\omega_{RO}$ at $\omega = \omega_{th,2}$ is as follows:

$$-\sin(\omega_{Ro}T)+(g+K)\hat{s}[1+\gamma+g)_-]^2+K\gamma\hat{s}[1+\gamma g)\hat{s}]^2\cos(\omega_{Ro}T)=0$$

where T=confinement factor=L/c, L is the total optical path of feedback and c is the velocity of light;

$g = G^{(3)} TV_0 A_g$, where $G^{(3)}$ is the third-order nonlinear gain, $V_0$ is the optical mode volume and $A_g$ is the differential gain coefficient;

$K = \tau_s/\tau_p$; where $\tau_s$ is the carrier lifetime, and $\tau_p$ is the photon lifetime;

$$\hat{s} = \frac{\omega - 1}{(1+\gamma+g/K)(1-\beta)}; \text{ and}$$

$\gamma$ is feedback coupling strength.

The average power focussed on facet 12 of laser diode $L_1$ is substantially similar to the average power on facet 32 of laser diode $L_2$. The reflecting properties of facet 32 is also substantially similar to the reflecting properties of facet 12. Preferably, the average power of the signal on facets 12 and 32 are the same within measurable levels of detection.

To attain a suitable, average power, optical cable 26 is selected to be of an appropriate length to achieve natural attenuation to appropriate power levels. In such a case, maximum separation distances may be achieved. Alternatively, an optical attenuator 46 (FIG. 3) may be placed before convergent lens 30 to ensure the same average optical power is focussed onto facet 32 as was focussed onto facet 12 in the transmitter laser 5.

While laser diode $L_1$ and laser diode $L_2$ have been described with reference to corresponding facets 12 and 32, it can be appreciated that the laser diode $L_1$ and laser diode $L_2$ may be of alternative semiconductor laser configurations, for example, a distributed bragg reflector (DBR) laser or other waveguide with gain. These lasers have an input end, for example, facet 12 or facet 32, and an output end, for example, facet 14 and facet 36, between which oscillation occurs. In such a case, average power onto all input ends are to be the same, within measurable levels of detection.

A converging lens 30 may be provided to assist focussing the clock signal incident onto facet 32.

The receiver 25 operates to receive, amplify and resend a clock pulse along the optical path.

The clock pulse is redirected through laser diode $L_2$ and re-emerges from another emitting facet 36 (output end). The emitting facet 36 has substantially the same reflecting properties as the facet 14 from the transmitter laser diode $L_1$. The clock pulse is focussed by lens 38 onto the cleaved facet end of another length of optical fibre 40 through which the clock pulse propagates a distance $d_3$ to another receiving laser (not shown).

The optical pulse train resent by the receiver laser 25 is made to reproduce the dynamics of the transmitter laser 5, through the process of dynamic generalized synchronization. (Ref. Pecora et al., Chaos, vol. 7, pp. 520–543, 1997.)

Figure 6:
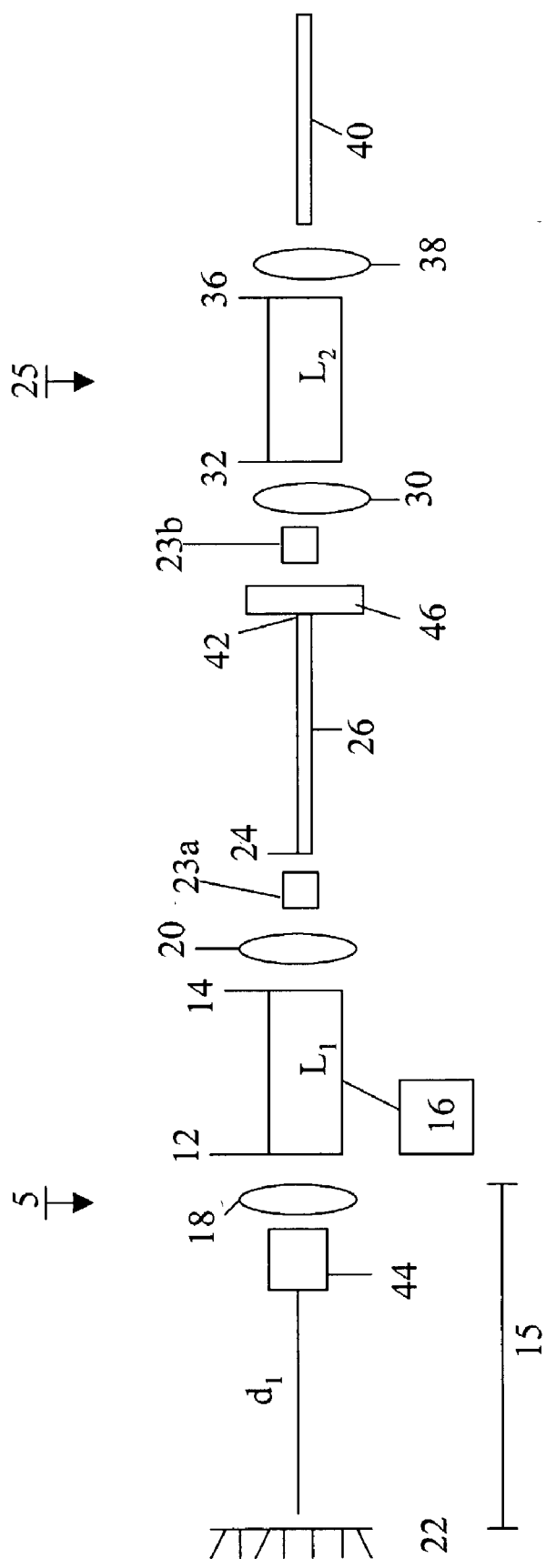
FIG. 6 is a schematic illustrating a transmitter laser and regenerating laser, in accordance with another embodiment of the invention.

In FIG. 6, another embodiment of the invention, a 90-degree polarizer 44 is placed in the external cavity 15, and a second 90-degree polarizer 46 is placed before the receiver laser diode 32. This has the effect of creating pulse signals through feedback into the laser carriers instead of the laser field.

Figure 7:
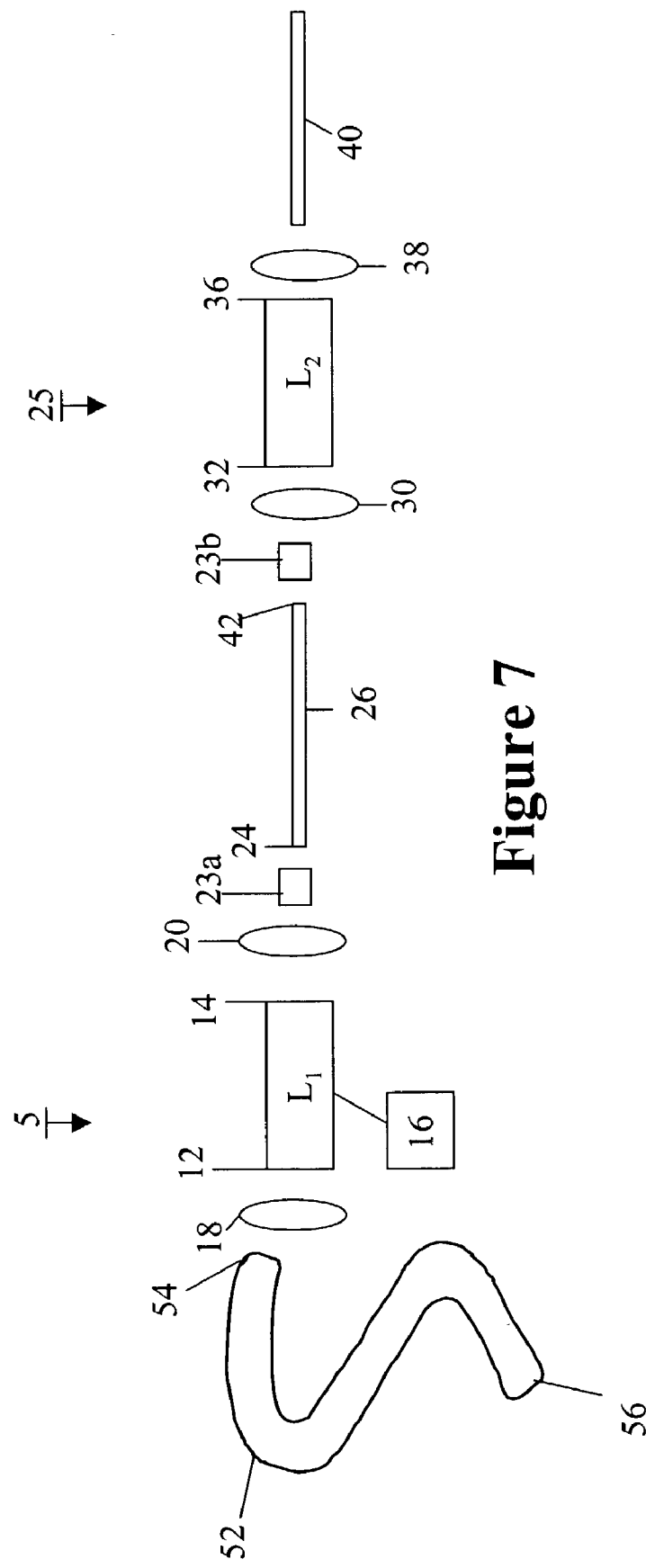
FIG. 7 is a schematic illustrating a transmitter laser, in accordance with another embodiment of the invention.

In FIG. 7, yet another embodiment of the invention, the free space external cavity 15 (including mirror 22 and lens 18) is replaced with an external waveguide 52, with one facet 54 anti-reflection coated and the second facet 56 coated appropriately, to generate the desired clock pulse train. The waveguide 52 may be coiled and contained adjacent to the laser diode $L_1$ 10. Alternatively, an external fibre Bragg grating may be used.

The transmitter lasers, the external cavity for the transmitter laser receiver lasers, and other associated elements may be packaged for use in an optical network in a variety of embodiments.

Laser diode $L_1$ may be contained in a module for use in an optical network. For example, laser diode $L_1$ may be contained in a detachable module including an RF connector, which includes a transmitter module. The RF clock rate (such as provided by BITs in SONET applications) may be fed directly into the transmitter with the synchronization and conversion to optical clock being done by the module and a length of fibre optic cable. The module may also contain other components such as convergent lens 20, isolators 23a, 23b, 23c, and the like. Alternatively, the module may be permanently attached to an optical component. In the further alternative, the module may be incorporated in another optical component or directly into an optical system.

The external cavity 15 may be contained in a separate module from the laser diode $L_1$ or integrated therewith in the same module. If contained in a separate module, the module may be permanently attached or detachably connected to the module for the laser diode $L_1$, so as to enable replacement of the module containing laser diode $L_1$ with another like module. Alternatively, the module may be permanently attached to an optical component. In the further alternative, the module may be incorporated in another optical component or directly into an optical system.

Similarly, laser diode $L_2$ may be contained in a module for use in an optical network. For example, laser diode $L_2$ may be contained in a detachable module for connection to a fibre optic line, a fibre optic in, a fibre optic out, and a pin for controlling power to the attenuator 46. The module may also contain other components such as convergent lens 20, isolators 23b and 23c, Faraday rotator, and the like.

Any number of receivers 25 may be provided along an optical path of an optical network system in any of the above-referenced configurations in order to maintain the synchronicity of clock pulses in the system. The maximum spacing between receivers is such that there is still sufficient average power focussed onto respective facet 32 to match the power focussed on facet 12. Alternatively, attenuators may be provided to adjust the average power. In each case, receiver lasers 25 include laser diodes, which are substantially the same in physical operation as laser diode $L_1$ and laser diode $L_2$. Each receiver laser produces the same dynamical properties in the same operating conditions as measurable (ie. within the error of detection as measurable by equipment).

Receiver lasers 25 may be uniformly spaced apart. Further, the system may be designed to require the application of the least effective amount of power to the input end of the receiver lasers.

In operation, a clock pulse generator 16 in synchronization with a reference clock (not shown) is coupled to and controls pulsed action by the transmitter laser diode $L_1$. The clock signal generated by the transmitting laser diode $L_1$ oscillates in the external cavity having a feedback delay time greater than the coherence length of the signal output. The clock signal, for example, as depicted in FIG. 4b, is incident on facet 12 with an average power p. The signal causes the receiver to synchronize to the transmitter. The signal is recovered by the process of dynamic synchronization. The clock signal output from laser diode $L_1$ displays dynamics similar to that depicted in FIG. 4a. The clock signal output is converged by lens 20 onto a cleaved facet end 24 and is propagated along a length of optical fibre 26. The clock signal power is attenuated by attenuator 46 (FIG. 3) and the clock signal is converged by lens 30 onto facet 32 of the receiver laser at an average power p. The clock signal output emitted from facet 36 is converged by lens 38 onto a cleaved end of a fibre optic 40 and displays dynamics as depicted in FIG. 5, similar to that depicted in FIG. 4a. The clock signal output is propagated along the length fibre 40 where the clock signal power is attenuated by another attenuator (not shown) and the clock signal is converged by lens (not shown) onto facet (not shown) of another regenerator laser located along the optical path at an average power p. This regenerator laser (not shown) emits the clock signal, also displaying dynamics, which then propagates along the optical path.

Advantageously, an all optical clock recovery system is provided, thereby avoiding the need for electronic clock recovery devices to be incorporated into an optical network. Jitter and noise are filtered from the clock signals produced in this system. Through the process of dynamic synchronization, the original signal is reproduced by the receiver laser. The receiver lasers can follow drift in an clock signal. Further, the degeneration of clock signal frequency will not affect operation. A system having clock rates produced in this fashion can respond to different communication network data rates thereby demonstrating intelligent agility.

It will be obvious to persons skilled in the art that numerous modifications, variations, and adaptations, may be made to the particular embodiments of the invention described above, without departing from the scope of the invention, which is defined in the claims.

What is claimed is:

1. A receiver for recovering an optical timing signal and adapted for use with a transmitter producing a dynamically synchronizable timing signal, the transmitter having an external resonator for feedback of the timing signal to the transmitter, the feedback having a delay time greater than a relaxation oscillation time for the transmitter, the transmitter outputting an optical timing signal having a characteristic dynamic, and wherein the receiver for recovering the optical timing signal comprises:
    a semiconductor laser configured to receive the timing signal and adapted to synchronize to the transmitter on receipt of the timing signal, whereby the laser outputs a recovered dining signal having the characteristic dynamic.

2. A receiver of claim 1, wherein the laser is a diode.

3. A receiver of claim 1,
    wherein the timing signal being fed back to the transmitter is fed at an average power.

4. A receiver of claim 1 wherein the timing signal inputted to the receiver laser is at the average power.

5. A receiver of claim 1
    wherein the timing signal used to dynamically synchronize the receiver laser is directly received from the output of the transmitter.

6. A receiver of claim 1, wherein the timing signal used to dynamically synchronize the receiver laser is indirectly received from the output of the transmitter.

7. A receiver of claim 1, wherein the transmitter includes a semiconductor laser which is substantially the same as the semiconductor laser configured to receive the timing signal.

8. A receiver of claim 1, wherein the external resonator has an external cavity configuration.

9. A receiver of claim 8, further comprising a first polarizer placed in the external cavity, and a second polarizer placed before the semiconductor laser.

10. A receiver of claim 1, wherein the external resonator is in an external waveguide configuration.

11. A receiver of claim 1, wherein the laser is a distributed Bragg reflector configuration.

12. A method of timing an optical link comprising the steps of:

generating a dynamically synchronizable timing signal by a transmitter laser;

resonating the timing signal in an external resonator, wherein the feedback of the timing signal in the resonator has a delay time greater than a relaxation oscillation time for the transmitter laser;

outputting the timing signal from the transmitter laser for propagation along an optical path; and using the timing signal to dynamically synchronize a semiconductor receiver laser, wherein the step of using the timing signal to dynamically synchronize the receiver laser includes the steps of;

inputting the timing signal to the receiver laser;

synchronizing the receiver to the transmitter laser; and outputting the timing signal from the receiver for propagation along the optical path, wherein the timing signal outputted from the receiver is used to dynamically synchronizer a subsequent receiver laser positioned along the optical path.

13. An optical link comprising:

a transmitter for generating a dynamically synchronizable optical timing signal, the transmitter having an external resonator for feedback of the timing signal thereto, the feedback having a delay time greater than the relaxation oscillation time for the transmitter, so as to output the optical timing signal having a characteristic dynamic; and a receiver configured to receive the dynamically synchronizable timing signal outputted with the characteristic dynamic from the transmitter, the receiver synchronizing to the transmitter and outputting a recovered timing signal having the characteristic dynamic, including a plurality of spaced apart receivers, each positioned in sequence along an optical path, each of the plurality of receivers configured to receive the dynamically synchronizable timing signal originally outputted with the characteristic dynamic from the transmitter, each of the plurality of receivers synchronizing to the transmitter on receiving the signal and outputting a recovered timing signal having the characteristic dynamic.

14. An optical link comprising:

a transmitter for generating a dynamically synchronizable optical timing signal, the transmitter having an external resonator for feedback of the timing signal thereto, the feedback having a delay time greater than the relaxation oscillation time for the transmitter, so as to output the optical timing signal having a characteristic dynamic; and a receiver configured to receive the dynamically synchronizable timing signal outputted with the characteristic dynamic from the transmitter, the receiver synchronizing to the transmitter and outputting a recovered timing signal having the characteristic dynamic, wherein the transmitter includes a first semiconductor laser and the receiver includes a second semiconductor laser.

15. An optical link of claim 14 wherein the first semiconductor laser is substantially the same as the second semiconductor laser.

16. An optical link of claim 14, wherein the first semiconductor laser is in an external cavity configuration.

17. An optical link of claim 16, wherein the external cavity length is selected to yield a feedback delay time greater than the relaxation oscillation time.

18. An optical link of claim 16, further comprising a first polarizer placed in the external cavity, and a second polarizer placed before the receiver laser.

19. An optical link of claim 14, wherein the external resonator is in an external waveguide configuration.

20. An optical link of claim 14, wherein the laser is a diode.

21. An optical link of claim 16, wherein the laser is a distributed Bragg reflector configuration.

* * * * *